United States Patent
Kaneko

(10) Patent No.: US 8,097,941 B2
(45) Date of Patent: Jan. 17, 2012

(54) SEMICONDUCTOR DEVICE HAVING PROJECTING ELECTRODE FORMED BY ELECTROLYTIC PLATING, AND MANUFACTURING METHOD THEREOF

(75) Inventor: Norihiko Kaneko, Fussa (JP)

(73) Assignee: Casio Computer Co., Ltd., Tokyo (JP)

( * ) Notice: Subject to any disclaimer, the term of this patent is extended or adjusted under 35 U.S.C. 154(b) by 0 days.

(21) Appl. No.: 12/566,423

(22) Filed: Sep. 24, 2009

(65) Prior Publication Data

US 2010/0015795 A1    Jan. 21, 2010

Related U.S. Application Data

(62) Division of application No. 11/936,179, filed on Nov. 7, 2007, now Pat. No. 7,619,306.

(30) Foreign Application Priority Data

Nov. 8, 2006 (JP) ................................. 2006-302633

(51) Int. Cl.
*H01L 23/02* (2006.01)

(52) U.S. Cl. ................. 257/690; 257/E23.023

(58) Field of Classification Search .......... 257/734–738, 257/779, 690, E23.023
See application file for complete search history.

(56) References Cited

U.S. PATENT DOCUMENTS

| | | | |
|---|---|---|---|
| 6,518,162 B2 | 2/2003 | Ono et al. | |
| 6,770,971 B2 * | 8/2004 | Kouno et al. | 257/734 |
| 7,429,793 B2 | 9/2008 | Yamagata | |
| 7,446,414 B2 * | 11/2008 | Watanabe | 257/737 |
| 7,528,480 B2 * | 5/2009 | Mihara | 257/700 |
| 7,618,886 B2 | 11/2009 | Jobetto et al. | |
| 7,737,543 B2 | 6/2010 | Jobetto et al. | |
| 7,745,931 B2 * | 6/2010 | Takao | 257/734 |
| 7,863,750 B2 * | 1/2011 | Shiota et al. | 257/759 |
| 2003/0230804 A1 | 12/2003 | Kouno et al. | |
| 2004/0195686 A1 | 10/2004 | Jobetto et al. | |
| 2005/0003651 A1 * | 1/2005 | Ho et al. | 438/614 |
| 2005/0098891 A1 * | 5/2005 | Wakabayashi et al. | 257/758 |

(Continued)

FOREIGN PATENT DOCUMENTS

CN    1568546 A    1/2005

(Continued)

OTHER PUBLICATIONS

Korean Office Action dated Mar. 27, 2009 and English translation thereof issued in a counterpart Korean Application No. 10-2007-0113162.

(Continued)

*Primary Examiner* — Nathan Ha
(74) *Attorney, Agent, or Firm* — Holtz, Holtz, Goodman & Chick, PC

(57) ABSTRACT

A semiconductor device includes a semiconductor substrate, and a plurality of wiring lines provided on one side of the semiconductor substrate, each of the wiring lines having a connection pad portion. An overcoat film is provided on the wiring lines and the one side of the semiconductor substrate. The overcoat film has a plurality of openings in parts corresponding to the connection pad portions of the wiring lines. A plurality of foundation metal layers are respectively provided on inner surfaces of the openings of the overcoat film and electrically connected to the pat portions of the wiring lines. A plurality of projecting electrodes are respectively provided on the foundation metal layers in the openings of the overcoat film.

7 Claims, 16 Drawing Sheets

U.S. PATENT DOCUMENTS

| | | | |
|---|---|---|---|
| 2005/0205993 A1* | 9/2005 | Yamaguchi | 257/738 |
| 2005/0242437 A1* | 11/2005 | Moxham et al. | 257/738 |
| 2006/0202353 A1 | 9/2006 | Wakabayashi et al. | |
| 2007/0108606 A1 | 5/2007 | Watanabe | |
| 2008/0191357 A1 | 8/2008 | Kouno et al. | |

FOREIGN PATENT DOCUMENTS

| | | |
|---|---|---|
| JP | 2001-144228 A | 5/2001 |
| JP | 2006-229113 A | 8/2006 |
| KR | 10-2005-0056865 A | 6/2005 |
| KR | 10-2005-0108308 A | 11/2005 |
| TW | 509998 B | 11/2002 |
| TW | 577160 B | 2/2004 |
| TW | 200503197 A | 1/2005 |

OTHER PUBLICATIONS

Korean Office Action dated Oct. 16, 2009 and English translation thereof issued in a counterpart Korean Application No. 10-2007-0113062.

Chinese Office Action dated Jan. 23, 2009 (and English translation thereof) in counterpart Chinese Application No. 200710159698.1.

Chinese Office Action dated May 26, 2011 (and English translation thereof) in counterpart Chinese Application No. 200710159698.1.

Taiwanese Office Action dated Jul. 6, 2011 (and English translation thereof) in counterpart Taiwanese Application No. 096141985.

* cited by examiner

SEMICONDUCTOR DEVICE HAVING PROJECTING ELECTRODE FORMED BY ELECTROLYTIC PLATING, AND MANUFACTURING METHOD THEREOF

CROSS-REFERENCE TO RELATED APPLICATIONS

The present application is a Divisional Application of U.S. application Ser. No. 11/936,179 filed Nov. 7, 2007, now U.S. Pat. No. 7,619,306 which is based upon and claims the benefit of priority from prior Japanese Patent Application No. 2006-302633, filed Nov. 8, 2006, the entire contents of which are incorporated herein by reference.

BACKGROUND OF THE INVENTION

1. Field of the Invention

The present invention relates to a semiconductor device having a projecting electrode formed by, for example, electrolytic plating, and a manufacturing method thereof.

2. Description of the Related Art

A conventional semiconductor device called a chip size package (CSP) has been disclosed by, for example, Jpn. Pat. Appln. KOKAI Publication No. 2006-229113. In this semiconductor device, wiring lines are provided on the upper surface of an insulating film provided on a semiconductor substrate, columnar electrodes are respectively provided on the upper surfaces of connection pad portions of the wiring lines, a sealing film is provided on the upper surfaces of the wiring lines and the insulating film so that the upper surface of this sealing film is flush with the upper surfaces of the columnar electrodes, and solder balls are provided on the upper surfaces of the columnar electrodes.

In a method of manufacturing the conventional semiconductor device, a dry film resist is used when the columnar electrodes are formed on the upper surface of the connection pad portions of the wiring lines. When this dry film resist is released, it is difficult to completely remove this dry film resist, and its residual tends to be partially left between the wiring lines on the insulating film. The presence of such resist residual leads to a problem causing, for example, a short circuit between the wiring lines or defects such as an insulation failure.

BRIEF SUMMARY OF THE INVENTION

It is an object of this invention to provide a semiconductor device capable of solving the foregoing problem, and a manufacturing method thereof.

A semiconductor device according to one aspect of the present invention, comprising:

a semiconductor substrate;

a plurality of wiring lines provided on one side of the semiconductor substrate, each of the wiring lines having a connection pad portion;

an overcoat film provided on the wiring lines and having a plurality of openings in parts corresponding to the connection pad portions of the wiring lines, each of the openings having an inner surface;

a plurality of foundation metal layers respectively provided on the inner surfaces of the openings of the overcoat film and electrically connected to the connection pad portions of the wiring lines; and a plurality of projecting electrodes respectively provided on the foundation metal layers in the openings of the overcoat film.

A semiconductor device manufacturing method according to another aspect of the present invention, comprising:

forming a plurality of wiring lines on one side of a semiconductor substrate;

forming, on the wiring lines and the one side of the semiconductor substrate, an overcoat film having openings in parts respectively corresponding to connection pad portions of the wiring lines;

forming foundation metal layers on inner surfaces of the openings of the overcoat film and parts of the wiring lines in the openings; and forming, by electrolytic plating, projecting electrodes on the foundation metal layers in the openings of the overcoat film.

According to the technique of the present invention, the overcoat film is provided so that it has the openings in the parts corresponding to the connection pad portions of the wiring lines, and the foundation metal layers are provided in the openings of the overcoat film, such that the steps of forming and releasing a dry film resist are not required, and a projecting electrode can be formed by electrolytic plating.

DESCRIPTION OF THE PREFERRED EMBODIMENT

First Embodiment

Figure 1:
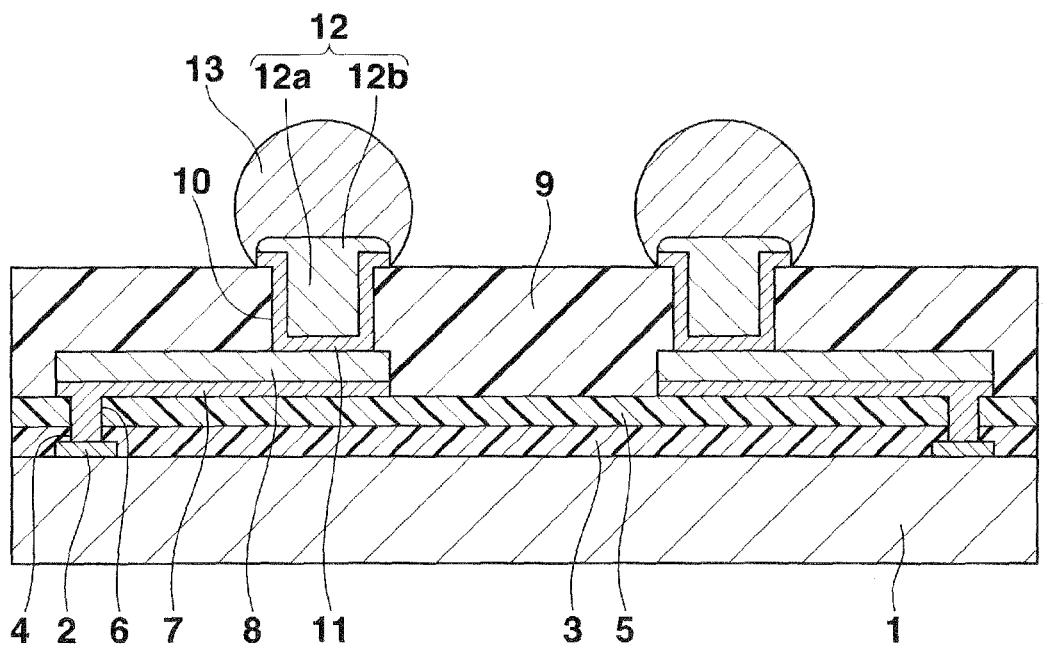
FIG. 1 is a sectional view showing a semiconductor device as a first embodiment of this invention.

FIG. 1 is a sectional view showing a semiconductor device as a first embodiment of this invention. This semiconductor device is called a CSP, and includes a silicon substrate (semiconductor substrate) 1. An integrated circuit (not shown) is provided on the upper surface of the silicon substrate 1, and a plurality of connection pads 2 made of a metal such as an aluminum-based metal are provided on peripheral parts of the upper surface of the silicon substrate 1 so that these connection pads are electrically connected to the integrated circuit.

An insulating film 3 made of, for example, silicon oxide, is provided on the upper surfaces of the connection pads 2 except for the centers of the connection pads 2 and on the upper surface of the silicon substrate 1. The centers of the connection pads 2 are exposed via openings 4 provided in the insulating film 3. A protective film 5 made of, for example, a polyimide-based resin is provided on the upper surface of the insulating film 3. Openings 6 are provided in parts of the protective film 5 respectively corresponding to the openings 4 of the insulating film 3.

A plurality of first foundation metal layers 7 made of a metal such as copper are provided on the upper surface of the protective film 5. A wiring line 8 made of copper is provided on the entire upper surface of each of the foundation metal layers 7. One end of the foundation metal layer 7 is electrically connected to the connection pad 2 via the openings 4 and 6 of the insulating film 3 and the protective film 5, so that the wiring line 8 is electrically connected to the connection pad 2. An overcoat film 9 made of, for example, a polyimide-based resin is provided on the upper surfaces of the wiring lines 8 and the protective film 5. An opening 10 having a predetermined diameter is provided in a part of the overcoat film 9 corresponding to a connection pad portion of each of the wiring lines 8. The cross section of this opening 10, and the cross section of a projecting electrode formed later accordingly are circular in this preferred embodiment, but are not limited to the circular shape and may also have other shapes such as polygonal and elliptic shapes.

A second foundation metal layer 11 made of, for example, copper is provided on the upper surface of the connection pad portion of each of the wiring lines 8 exposed via the opening 10 of the overcoat film 9, on the entire inner peripheral surface of the opening 10 of the overcoat film 9, and on a circular part of the upper surface of the overcoat film 9 around the opening 10. A projecting electrode 12 made of copper is provided on the entire upper surface of each of the foundation metal layers 11.

In this case, each projecting electrode 12 includes a lower projecting electrode portion 12a and an upper projecting electrode portion 12b. The lower portion 12a is entirely provided or filled in the opening 10 of the overcoat film 9. The upper portion 12b is directly provided or attached on the entire upper surface of the lower portion 12a and on the outer peripheral part of the foundation metal layer 11 on a part of the overcoat film 9 around the opening 10. A solder ball 13 is provided on the upper surface of the upper projecting electrode portion 12b of the projecting electrode 12 including the end side face (outer peripheral end face) of the outer peripheral part of the foundation metal layer 11 provided on the overcoat film 9.

(One Example of Manufacturing Method)

Figure 2:
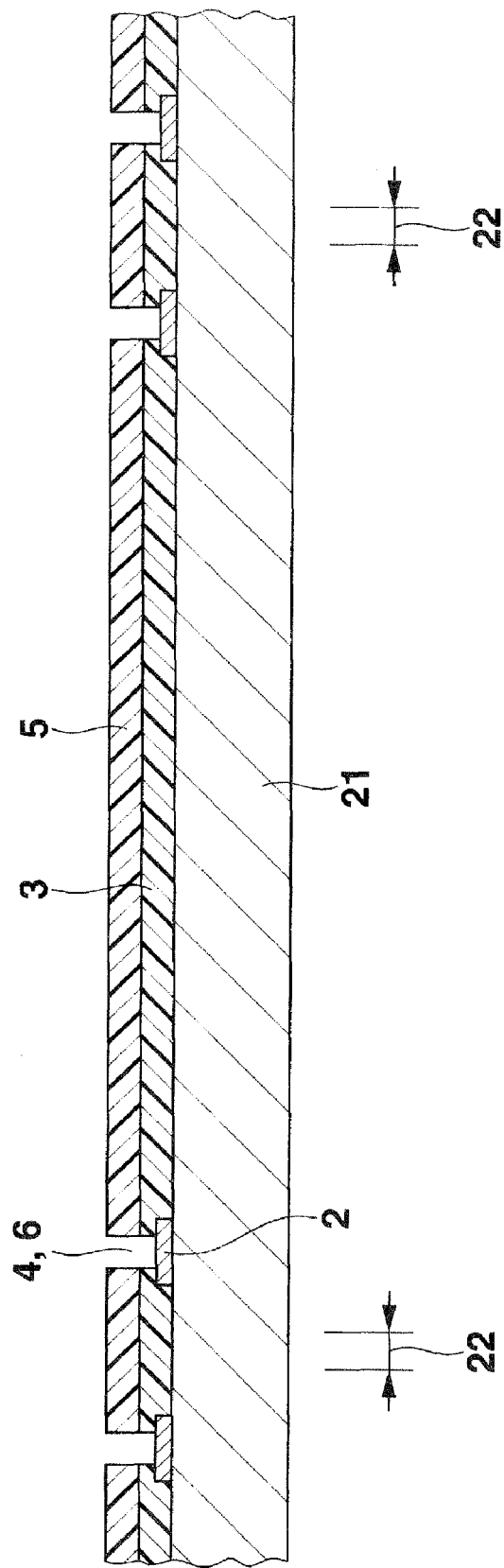
FIG. 2 is a sectional view of an initially prepared assembly in one example of a method of manufacturing the semiconductor device shown in FIG. 1.

One example of a method of manufacturing this semiconductor device will now be described. First, as shown in FIG. 2, an assembly is prepared wherein the connection pads 2 made of the aluminum-based metal, the insulating film 3 made of, for example, silicon oxide, and the protective film 5 made of, for example, polyimide-based resin are formed on the upper side of a silicon substrate (hereinafter referred to as a semiconductor wafer 21) in a wafer state. The centers of the connection pads 2 are exposed via the openings 4 and 6 respectively formed in the insulating film 3 and the protective film 5.

In this case, integrated circuits (not shown) having a predetermined function are formed in regions on the upper surface of the semiconductor wafer 21 where the semiconductor devices are formed, and the connection pads 2 are electrically connected to the integrated circuits formed in corresponding parts. In FIG. 2, regions indicated by a numeral 22 correspond to dicing lines.

Figure 3:
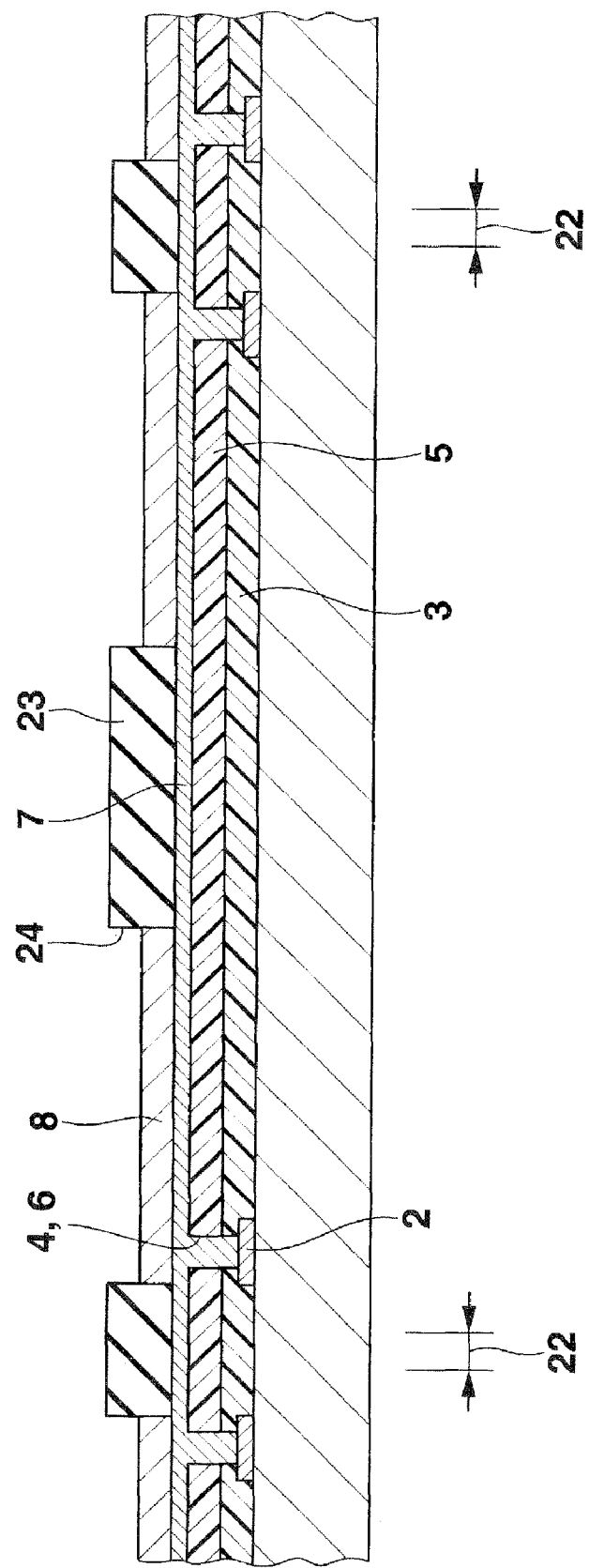
FIG. 3 is a sectional view of the assembly in a step following FIG. 2.

Next, as shown in FIG. 3, the foundation metal layer (to be precise, this is a layer for forming the foundation metal layer 7, but this layer is also referred to as the foundation metal layer 7 for the simplification of explanation) 7 is formed on the upper surfaces of the connection pads 2 exposed via the openings 4 and 6 of the insulating film 3 and the protective film 5 and on the entire upper surface of the protective film 5. The foundation metal layer 7 may only be a copper layer formed by electroless plating, may only be a copper layer formed by sputtering, or may be a copper layer formed by sputtering on a thin film layer such as titanium formed by sputtering.

Figure 4:
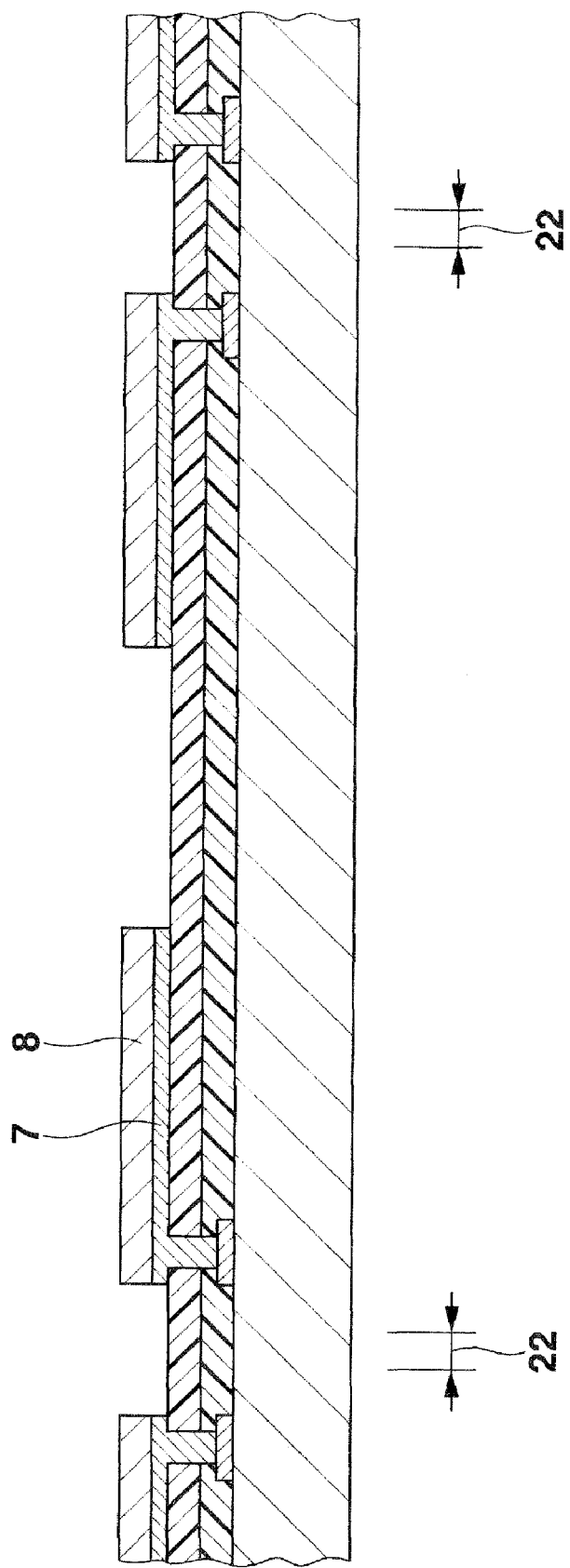
FIG. 4 is a sectional view of the assembly in a step following FIG. 3.

Next, a plating resist film 23 is formed on the upper surface of the foundation metal layer 7, by patterning of a resist film. In this case, an opening 24 is formed in the plating resist film 23 in a part corresponding to a region where the wiring line 8 is to be formed. Then, electrolytic plating with copper is carried out using the foundation metal layer 7 as a plating current path, thereby forming the wiring lines 8 on the upper surface of the foundation metal layer 7 in the openings 24 of the plating resist film 23. Subsequently, the plating resist film 23 is entirely removed, and then the parts of the foundation metal layer 7 in regions which are not under the wiring line 8 are etched and thus removed, by using the wiring lines 8 as a mask. Thus, the foundation metal layer 7 remains under each of the wiring lines 8 alone, as shown in FIG. 4.

Figure 5:
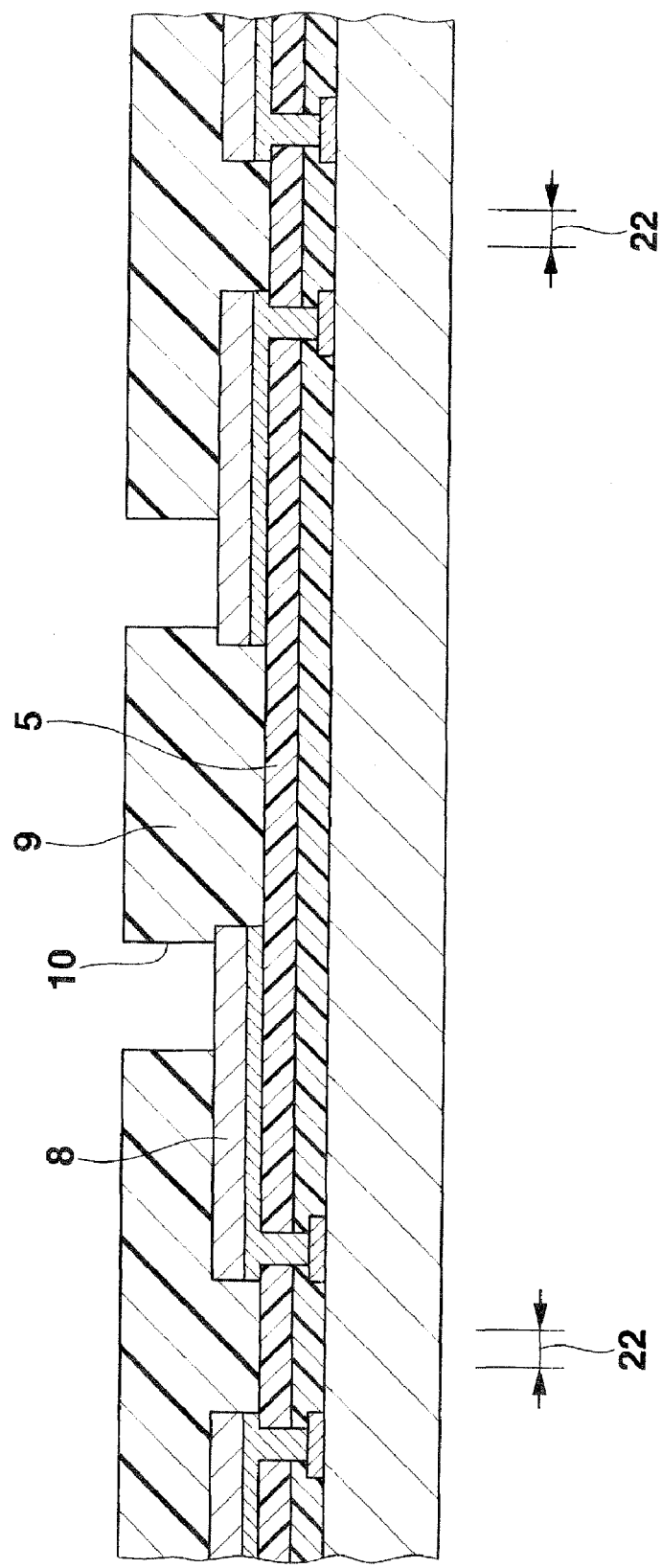
FIG. 5 is a sectional view of the assembly in a step following FIG. 4.

Next, the overcoat film 9 made of, for example, a polyimide-based resin is formed on the upper surfaces of the wiring lines 8 and the protective film 5 by, for example, a spin coat method or a transfer molding method. Then, as shown in FIG. 5, the openings or through holes 10 are formed in parts of the overcoat film 9 corresponding to the connection pad portions or inner side portions of the wiring lines 8 by a photolithographic method to expose the connection pad portions.

Figure 6:
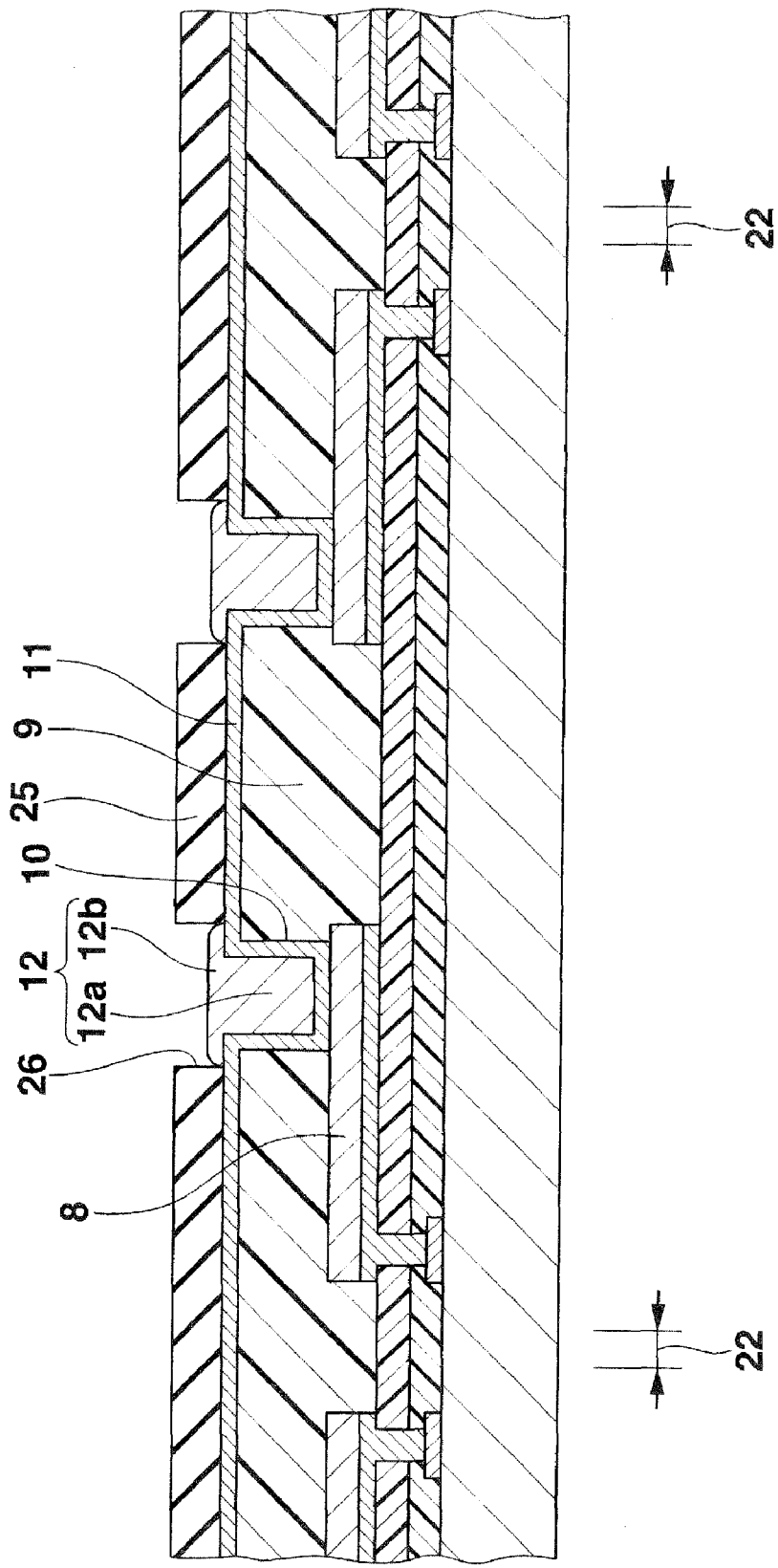
FIG. 6 is a sectional view of the assembly in a step following FIG. 5.

Next, the second foundation metal layer (to be precise, this is a layer for forming the foundation metal layer 11, but this layer is also referred to as the foundation metal layer 11 for the simplification of explanation) 11 is formed by, for example, the sputtering of copper on the upper surface of the connection pad portion of each of the wiring lines 8 exposed via the opening 10 of the overcoat film 9 and on the entire upper surface of the overcoat film 9. Then, as shown in FIG. 6, a plating resist film 25 is formed/patterned on the upper surface of the foundation metal layer 11.

In this case, an opening 26 having a cross section slightly larger than that of the opening 10 of the overcoat film 9 is formed concentrically with each of the openings 10 in a part of the plating resist film 25 corresponding to a region where the upper projecting electrode portion 12b of the projecting electrode 12 is to be formed. The opening 26 of the plating resist film 25 is set to be slightly larger than the opening 10 of the overcoat film 9 because alignment accuracy for forming the openings 10 and 26 is considered.

Next, electrolytic plating with copper is carried out, by using the foundation metal layer 11 as a plating current path, such that the lower projecting electrode portion 12a is formed on a part of the foundation metal layer 11 in each of the openings 10 of the overcoat film 9 to completely fill the opening 10. Then, the upper projecting electrode portion 12b is formed, by an electrolytic plating method, on the lower projecting electrode portion 12a in the opening 26 of the plating resist film 25 and on a circular part of the foundation metal layer 11.

In this case, since the opening 26 of the plating resist film 25 is slightly larger than the opening 10 of the overcoat film 9, plating is isotropically deposited in each of the openings 26 of the plating resist film 25. Therefore, the upper projecting electrode portion 12b formed in the opening 26 of the plating resist film 25 is shaped with a bulging center. Thus, the projecting electrode 12 composed of the lower portion 12a and the upper portion 12b is formed.

Figure 7:
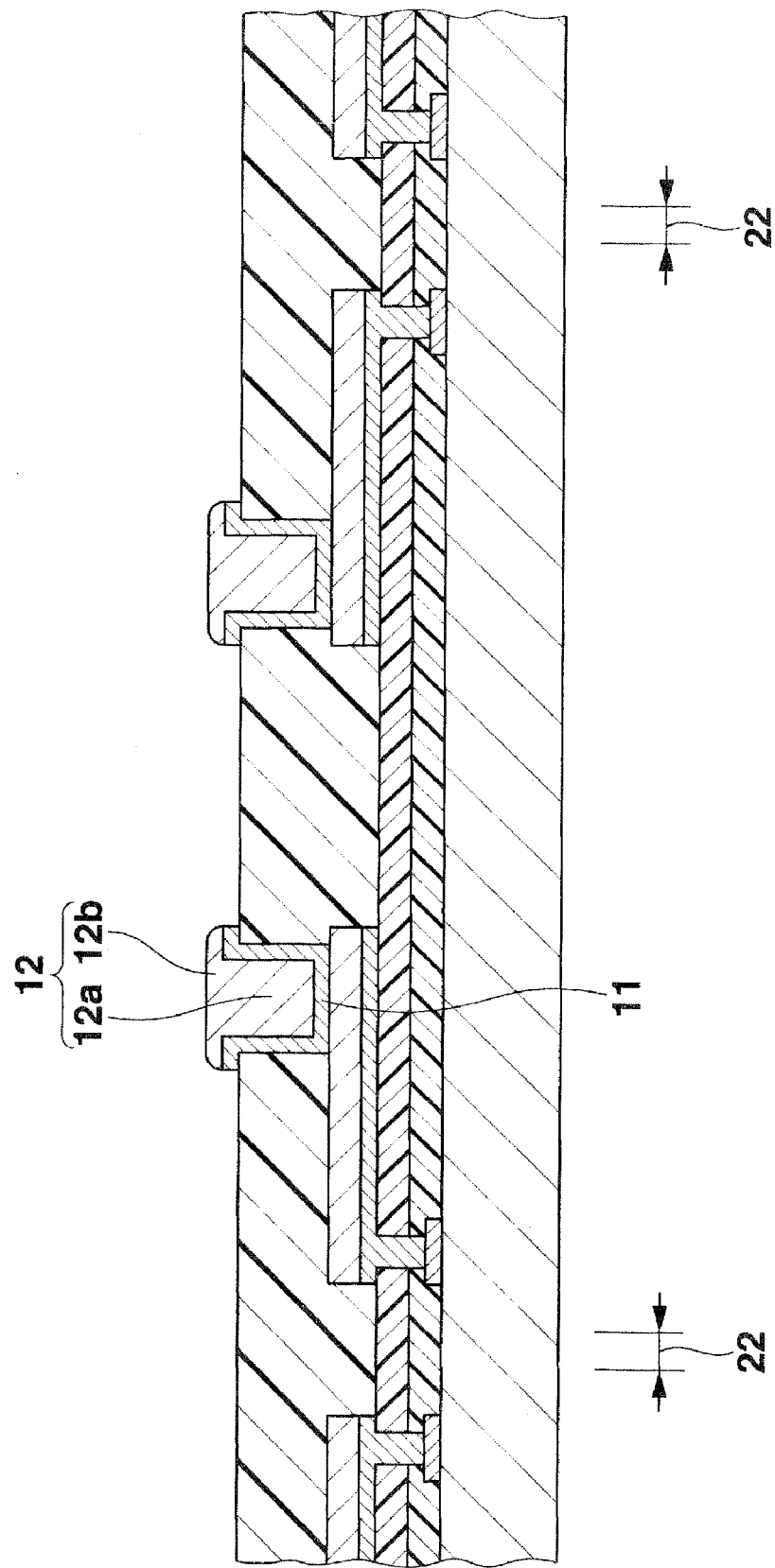
FIG. 7 is a sectional view of the assembly in a step following FIG. 6.

Next, the plating resist film 25 is entirely removed. Then the projecting electrodes 12 are used as a mask to etch and remove parts of the foundation metal layer 11 in regions which are not under the projecting electrodes 12, such that the foundation metal layers 11 remain under the projecting electrodes 12 alone, as shown in FIG. 7. Subsequently, a flux (not shown) is applied onto the upper surface of the upper portion 12b of each of the projecting electrodes 12 by a screen printing method, and a solder ball (not shown) is then mounted on the upper surface of the flux.

Figure 8:
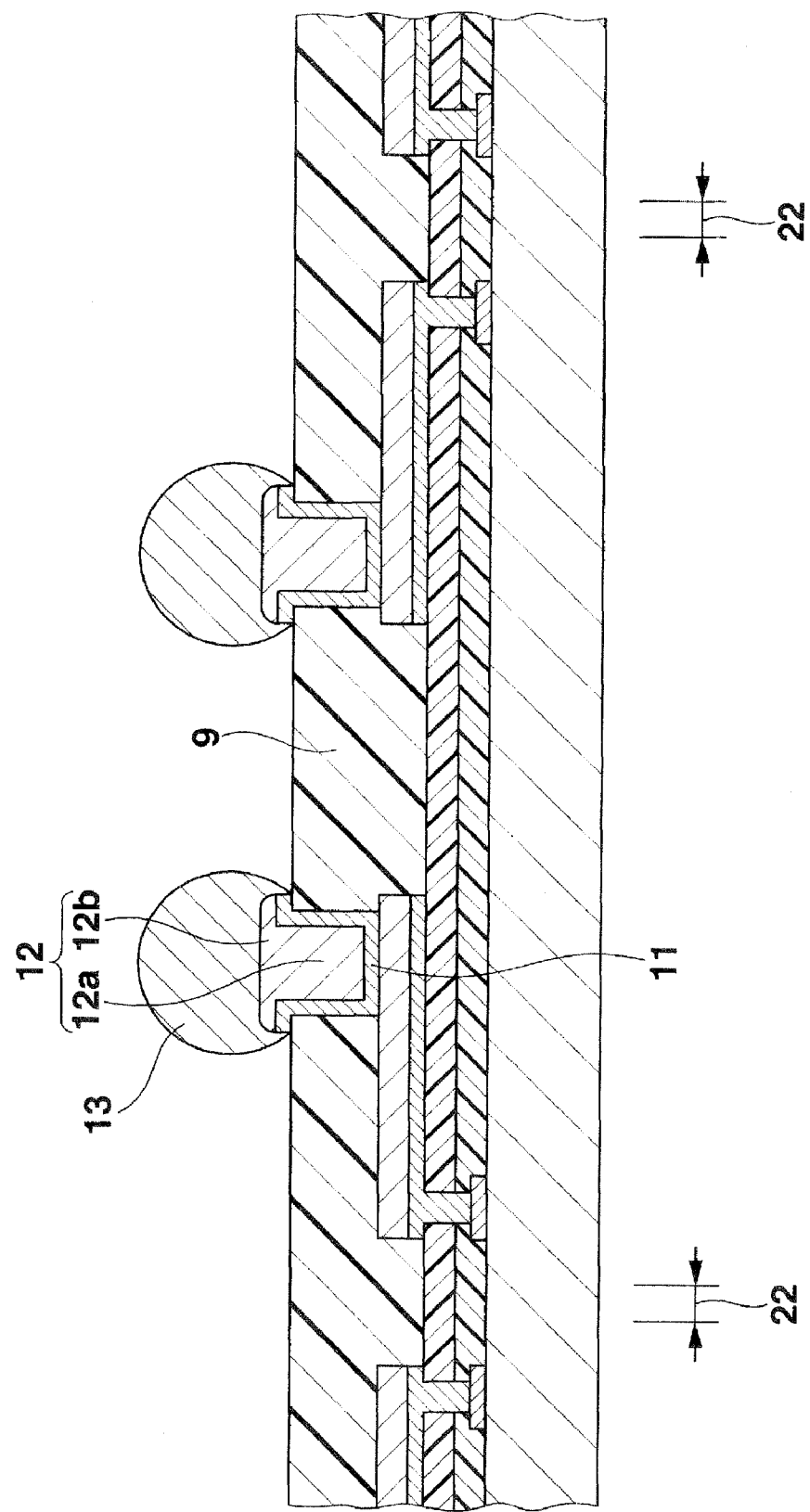
FIG. 8 is a sectional view of the assembly in a step following FIG. 7.
Figure 9:
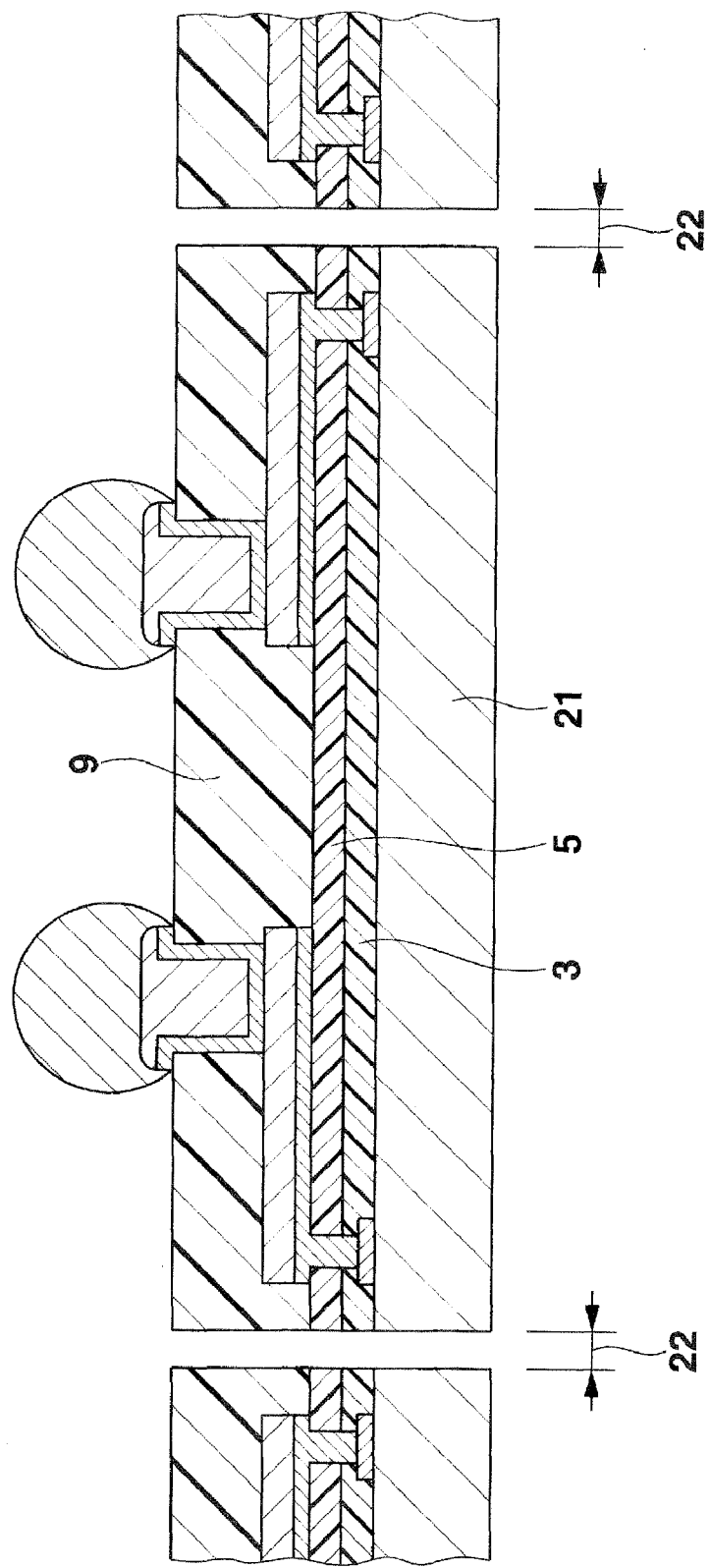
FIG. 9 is a sectional view of the assembly in a step following FIG. 8.

Next, after a reflow process, the solder ball mounted on the upper surface of the flux is melted, and then rounded and solidified by surface tension, such that the solder ball 13 of a substantially spherical or semi-spherical shape is formed on the upper surface of the upper portion 12b of each of the projecting electrodes 12 including the end face of the foundation metal layer 11 formed on the upper surface of the overcoat film 9, as shown in FIG. 8. Then, as shown in FIG. 9, the semiconductor wafer 21, the insulating film 3, the protective film 5 and the overcoat film 9 are cut along the dicing lines 22, thereby obtaining a plurality of semiconductor devices shown in FIG. 1.

As described above, in one example of the method of manufacturing this semiconductor device, the overcoat film 9 having the opening 10 in the part corresponding to the connection pad portion of each of the wiring lines 8 is formed on the wiring line 8 and the protective film 5, and the projecting electrode 12 is formed by electrolytic plating on the connection pad portion of the wiring line 8 in each of the openings 10 of the overcoat film 9, such that there is no longer a need for a special process of grinding.

A semiconductor device manufacturing method described in Jpn. Pat. Appln. KOKAI Publication No. 2006-229113 mentioned above is explained with reference to FIG. 3. In this method, the plating resist film 23 is released, and a projecting electrode forming plating resist film having an opening in a part corresponding to the connection pad portion of the wiring line 8 is formed on the upper surface of the foundation metal layer 7 including the wiring line 8. Then, electrolytic plating using the foundation metal layer 7 as a plating current path is carried out to form a projecting electrode on the upper surface of the connection pad portion of the wiring line 8 in the opening of the projecting electrode forming plating resist film. Further, the projecting electrode forming plating resist film is released using a resist releasing solution, and the wiring line 8 is used as a mask to etch and remove the foundation metal layer 7 in regions which are not under the wiring line 8.

In the semiconductor device manufacturing method described in the above patent document, if a dry film resist is used as the projecting electrode forming plating resist film, the projecting electrode forming plating resist film is released mainly from its upper surface side when released with the resist releasing solution, so that a smaller distance between the wiring lines may lead to the production of resist residual between the wiring lines. This resist residual acts as a mask and causes an etching failure when the foundation metal layer is etched using the wiring line as a mask, leading to a short circuit between the wiring lines.

On the other hand, in one example of the method of manufacturing the semiconductor device described above, the overcoat film 9 is formed on the upper surfaces of the wiring line 8 and the protective film 5, and the plating resist film 25 is formed on the upper surface of the foundation metal layer 11 formed on the entire upper surface of the overcoat film 9, such that there is no room for the plating resist film 25 to come between the wiring lines 8, and the resist residual can be prevented from being easily produced when the plating resist film 25 is released.

(Another Example of Manufacturing Method)

Figure 10:
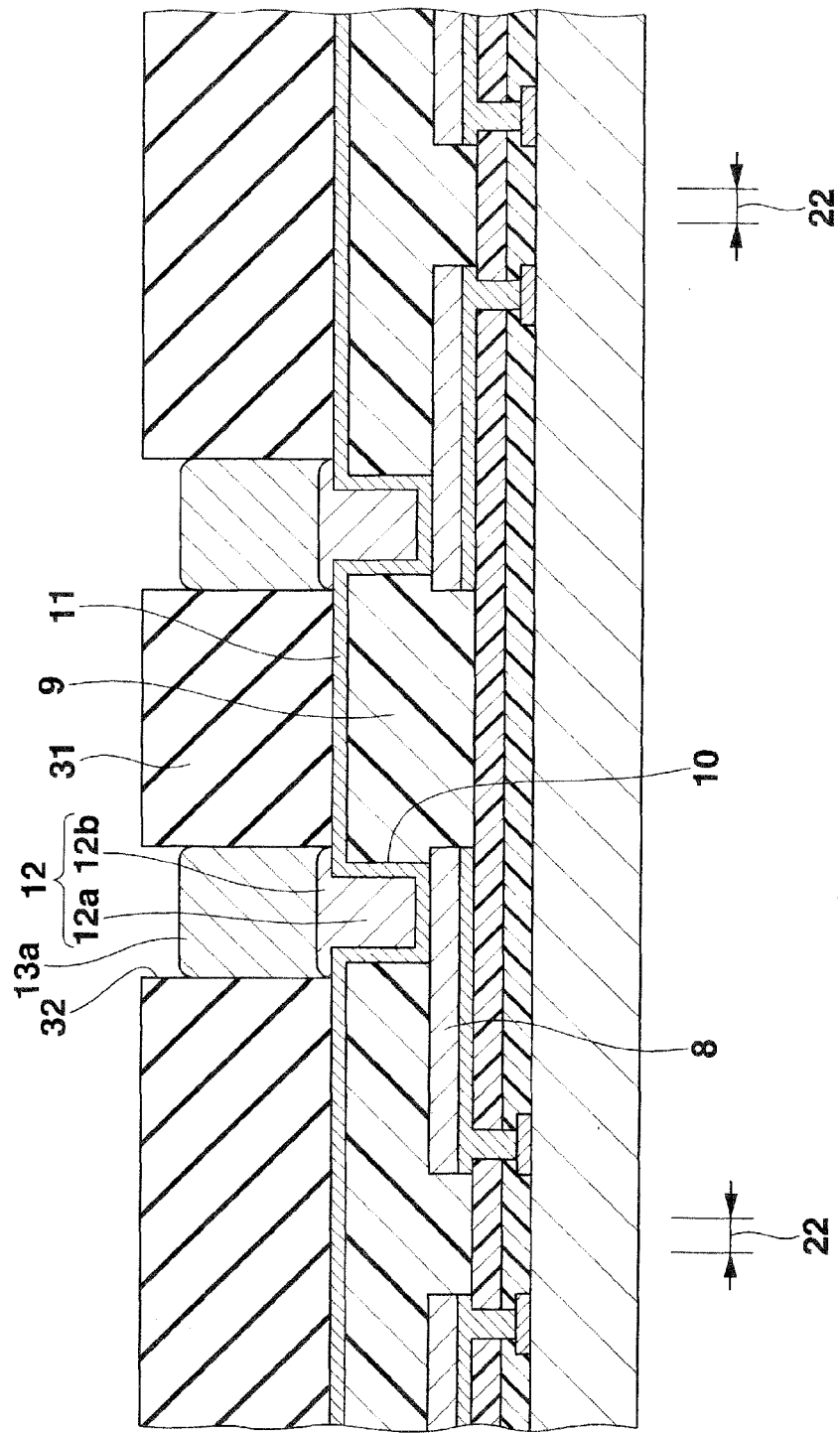
FIG. 10 is a sectional view of the assembly in a predetermined step in another example of the method of manufacturing the semiconductor device shown in FIG. 1.

Another example of the method of manufacturing the semiconductor device shown in FIG. 1 will now be described. First, in a step as shown in FIG. 6, a plating resist film 31 is patterned/formed on the upper surface of the foundation metal layer 11, as shown in FIG. 10. In this case, the thickness of the plating resist film 31 is somewhat larger than the thickness of the plating resist film 25 shown in FIG. 6. Moreover, an opening 32 is formed in a part of the plating resist film 31 corresponding to a region where the upper projecting electrode portion 12b of the projecting electrode 12 is formed.

Next, electrolytic plating with copper is carried out using the foundation metal layer 11 as a plating current path such that the lower projecting electrode portion 12a is formed on the foundation metal layer 11 in the opening 10 of the overcoat film 9, and the upper projecting electrode portion 12b is then formed on the lower projecting electrode portion 12a in the opening 32 of the plating resist film 31 and on the partial upper surface of the foundation metal layer 11. Thus, the projecting electrode 12 composed of the lower projecting electrode portion 12a and the upper projecting electrode portion 12b is formed.

Next, electrolytic plating with solder is carried out using the foundation metal layer 11 as a plating current path such that a solder ball forming solder layer 13a is formed on the upper surface of the upper projecting electrode portion 12b of the projecting electrode 12 in the opening 32 of the plating resist film 31. It will be appreciated that this method can omit the flux application step and solder ball mounting step in one example of the semiconductor device manufacturing method described above.

Figure 11:
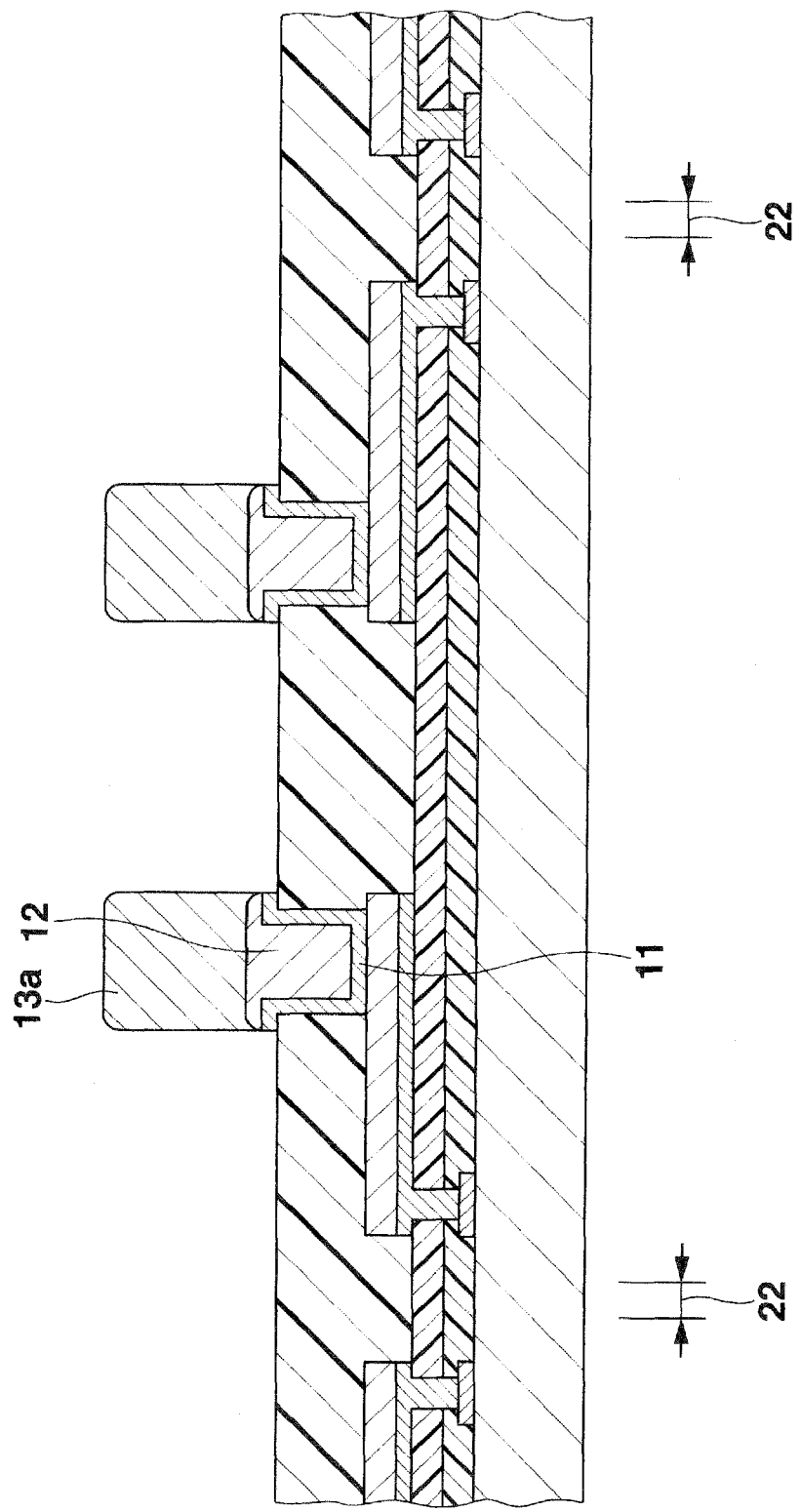
FIG. 11 is a sectional view of the assembly in a step following FIG. 10.

Next, the plating resist film 31 is released, and the solder ball forming solder layer 13a is used as a mask to etch and remove the foundation metal layer 11 in regions which are not under the solder ball forming solder layer 13a, such that the foundation metal layer 11 only remains under the projecting electrode 12 under the solder ball forming solder layer 13a, as shown in FIG. 11.

Next, after a reflow process, the solder ball forming solder layer 13a is melted, and then rounded and solidified by surface tension, such that the solder ball 13 is formed on the upper surface of the upper projecting electrode portion 12b of the projecting electrode 12 including the end face of the foundation metal layer 11 formed on the upper surface of the overcoat film 9, as shown in FIG. 8. Subsequent steps are the same as those in one example of the semiconductor device manufacturing method described above and are therefore not described.

Here, one example of the dimensions of parts of the semiconductor device shown in FIG. 1 is explained. The thickness of the protective film 5 is 2 to 10 μm. The thickness of the copper layer of the foundation metal layer 7, 11 is 0.3 to 1 am. The thickness of the wiring line 8 is 1 to 20 μm, and is preferably 3 to 8 μm. The thickness of the overcoat film 9 is 20 to 120 μm, and is preferably 30 to 80 μm, but may be relatively large and 100 to 120 μm. The diameter of the opening 10 of the overcoat film 9 is 80 to 300 μm, but may be 20 to 200 μm, for example, when the diameter of the lower projecting electrode portion 12a of the projecting electrode 12 is small due to the miniaturization of the wiring line 8 as described later with reference to FIG. 12. The height of the upper portion 12b of the projecting electrode 12 is 10 μm or less with reference to the upper surface of the overcoat film 9. That is, a distance between the top of the electrode 12 and the upper surface of the overcoat film 9 is 10 μm or less.

In the case of the semiconductor device shown in FIG. 1 described above, the projecting electrode 12 is structured to have the upper projecting electrode portion 12b on the lower projecting electrode portion 12a, and the height of the upper projecting electrode portion 12b is 10 μm or less with reference to the upper surface of the overcoat film 9, but the present invention is not limited to this. That is, the projecting electrode 12 may be structured to only have the lower projecting electrode portion 12a whose upper surface is flush with the upper surface of the overcoat film 9. However, forming such flush surfaces is relatively difficult in terms of a process, so that the projecting electrode 12 may rather project to some degree, for example, 10 μm or less toward the upper side of the overcoat film 9 as described above.

Second Embodiment

Figure 12:
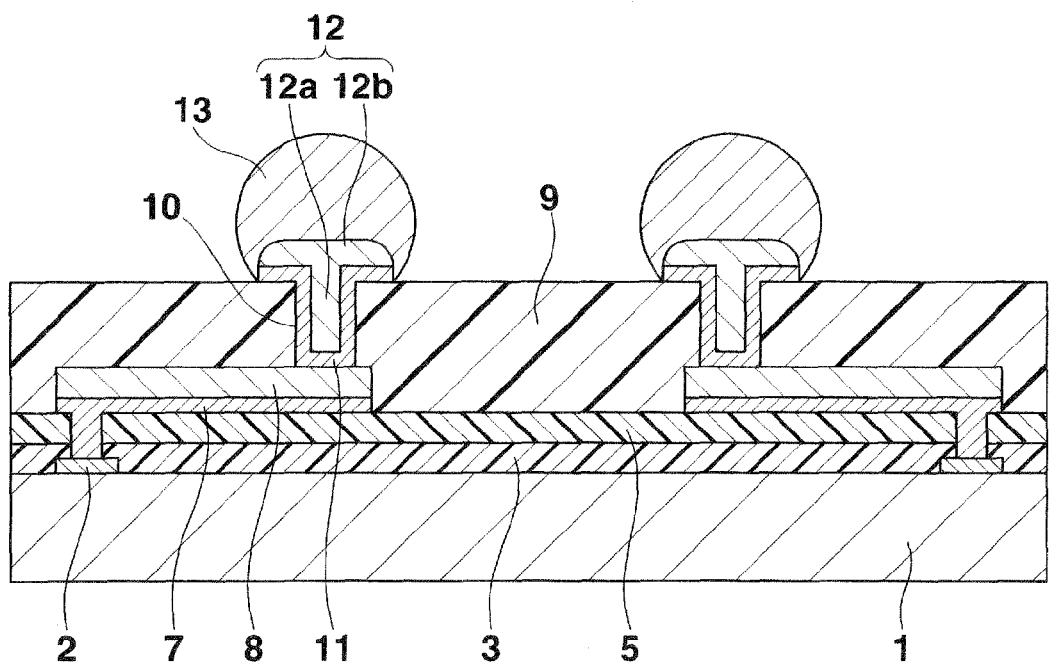
FIG. 12 is a sectional view showing a semiconductor device as a second embodiment of this invention.

FIG. 12 is a sectional view of a semiconductor device as a second embodiment of this invention. This semiconductor device is different from the semiconductor device shown in FIG. 1 in that, in a projecting electrode 12, the diameter of a lower projecting electrode portion 12a (part in an opening 10 of an overcoat film 9) is somewhat smaller while the diameter of an upper projecting electrode portion 12b remains the same.

In such a case, in contrast with the semiconductor device shown in FIG. 1, when the pitch of the projecting electrodes 12 is constant, the diameter of the lower projecting electrode portion 12a (thus the opening 10 of the overcoat film 9) can be reduced to some extent, and the diameter of a connection pad portion of a wiring line 8 (including a foundation metal layer 7) serving as a support of the lower projecting electrode portion 12a can be reduced to some extent even if the diameter of the upper projecting electrode portion 12b serving as a support of a solder ball 13 remains the same. Thus, the distance between the connection pad portions of the wiring lines 8 can be increased, so that the number of drawn wire portions of the wiring lines 8 that can be disposed between the connection pad portions of the wiring lines 8 can be increased, or, for example, the width of the drawn wire portion of the wiring line 8 can be designed with a margin.

Third Embodiment

Figure 13:
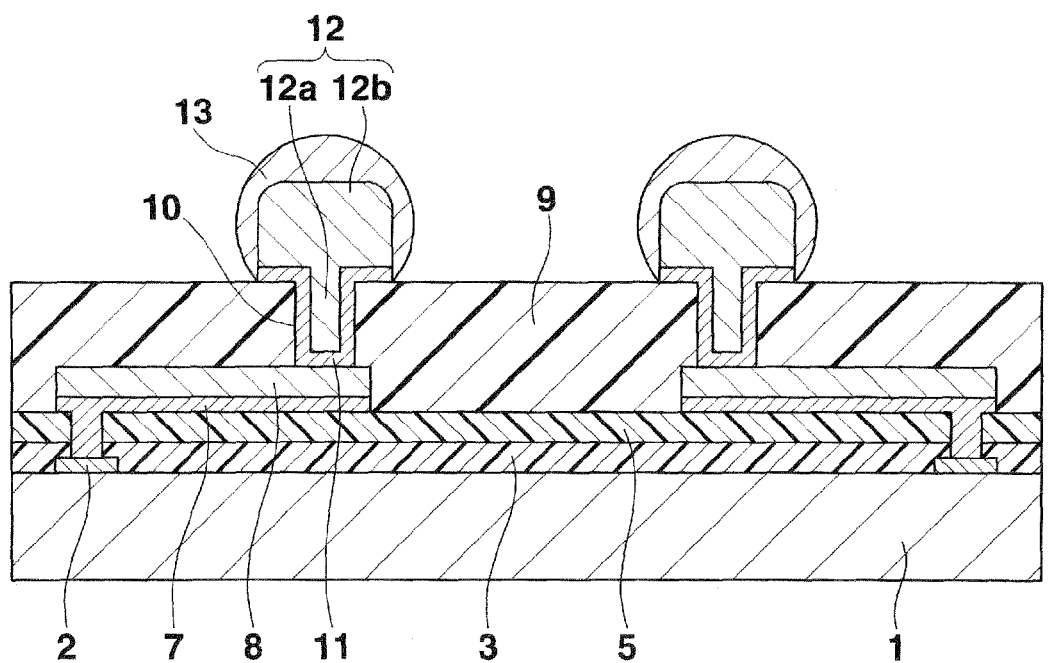
FIG. 13 is a sectional view of a semiconductor device as a third embodiment of this invention.

FIG. 13 shows a sectional view of a semiconductor device as a third embodiment of this invention. This semiconductor device is different from the semiconductor device shown in FIG. 12 in that the height of an upper projecting electrode portion 12b of a projecting electrode 12 is increased and the area of junction between a solder ball 13 formed on the surface of the upper portion 12b and the upper portion 12b is increased, while the substantial diameter of the solder ball 13 remains the same (that is, substantially same diameter as that in the first and second embodiments). In such a case, since the area of junction or interface between the solder ball 13 and the upper projecting electrode portion 12b can be larger, the strength of junction of the solder ball 13 with the upper portion 12b (that is, the electrode 12) can be increased.

Figure 14:
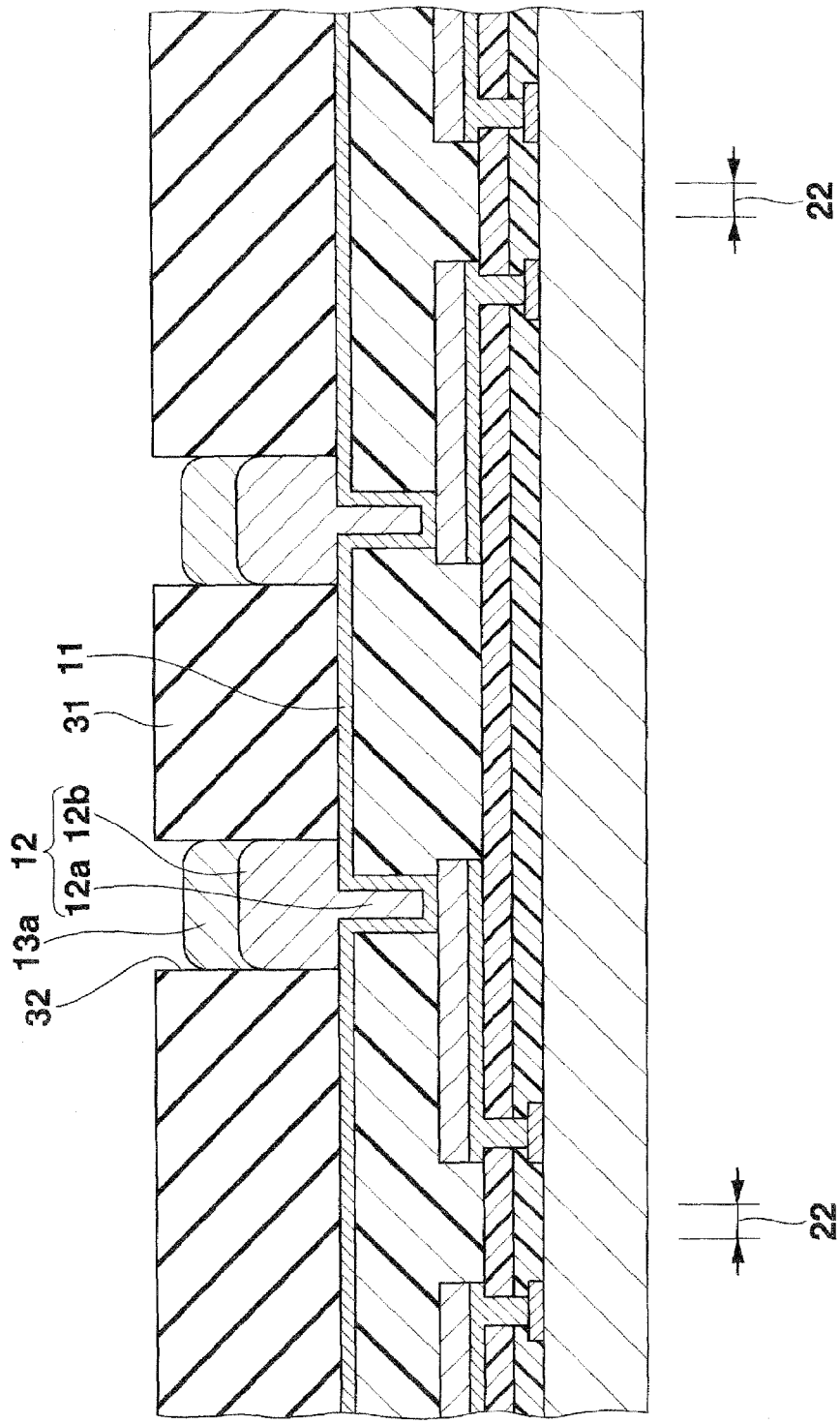
FIG. 14 is a sectional view of an assembly in a predetermined step in one example of a method of manufacturing the semiconductor device shown in FIG. 13.

One example of a method of manufacturing the semiconductor device shown in FIG. 13 will now be described. In this case, in a step as shown in FIG. 14 corresponding to FIG. 10, the upper projecting electrode portion 12b is formed in a circular opening 32 of a thick plating resist film 31 so that its height may be 20 to 200 μm, preferably 30 to 80 μm, and a solder ball forming solder layer 13a is formed on the upper portion 12b so that its height (thickness) may be 10 to 100 μm, preferably 20 to 50 μm.

Figure 15:
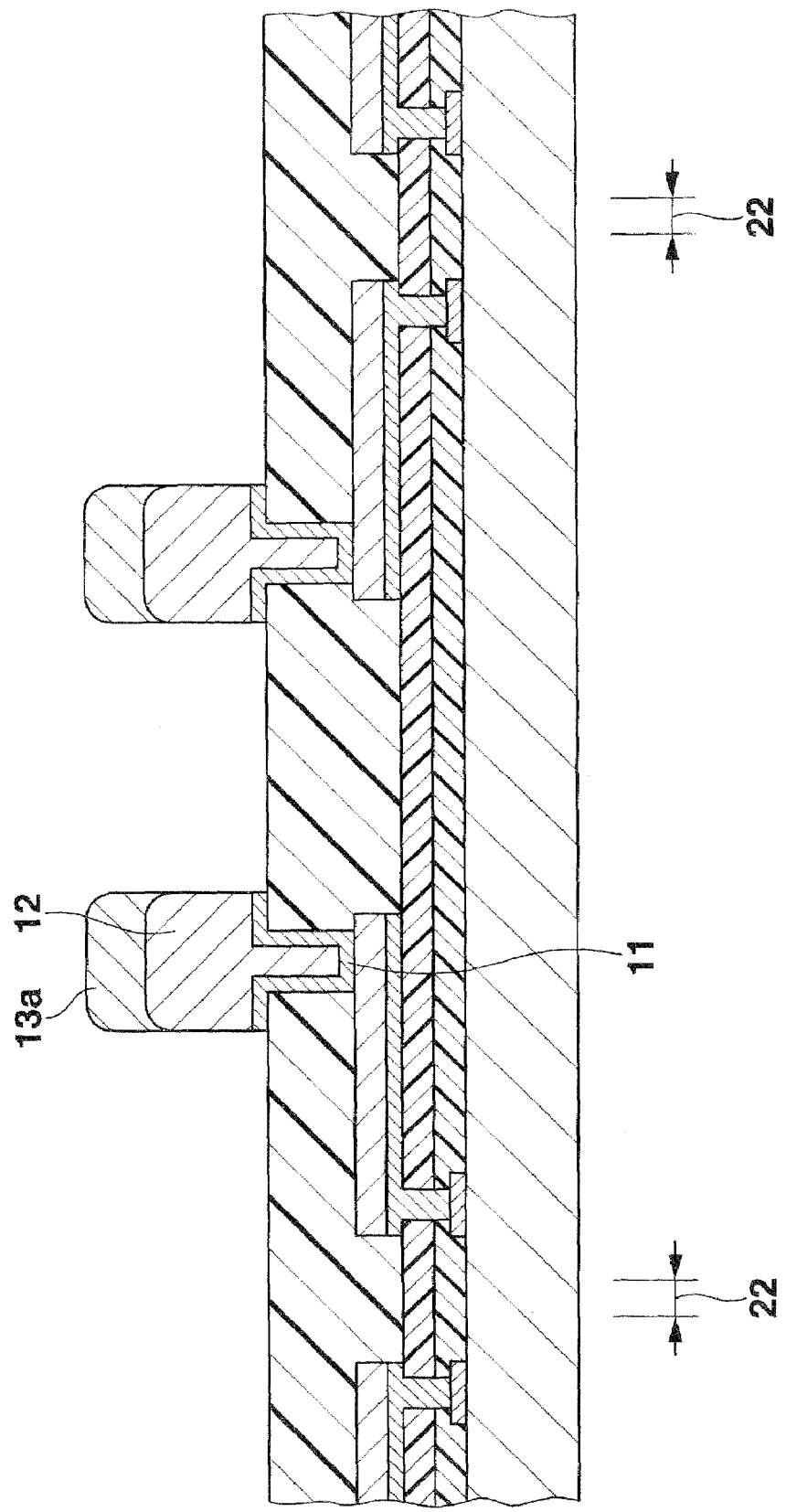
FIG. 15 is a sectional view of the assembly in a step following FIG. 14.

Next, the plating resist film 31 is entirely removed, and the solder ball forming solder layers 13a are used as a mask to etch and remove a foundation metal layer 11 in regions which are not under the solder ball forming solder layers 13a, such that the foundation metal layer 11 only remains under the projecting electrode 12 under the solder ball forming solder layer 13a, as shown in FIG. 15. Then, a plurality of semiconductor devices shown in FIG. 13 are obtained through a reflow process and a dicing step.

Fourth Embodiment

Figure 16:
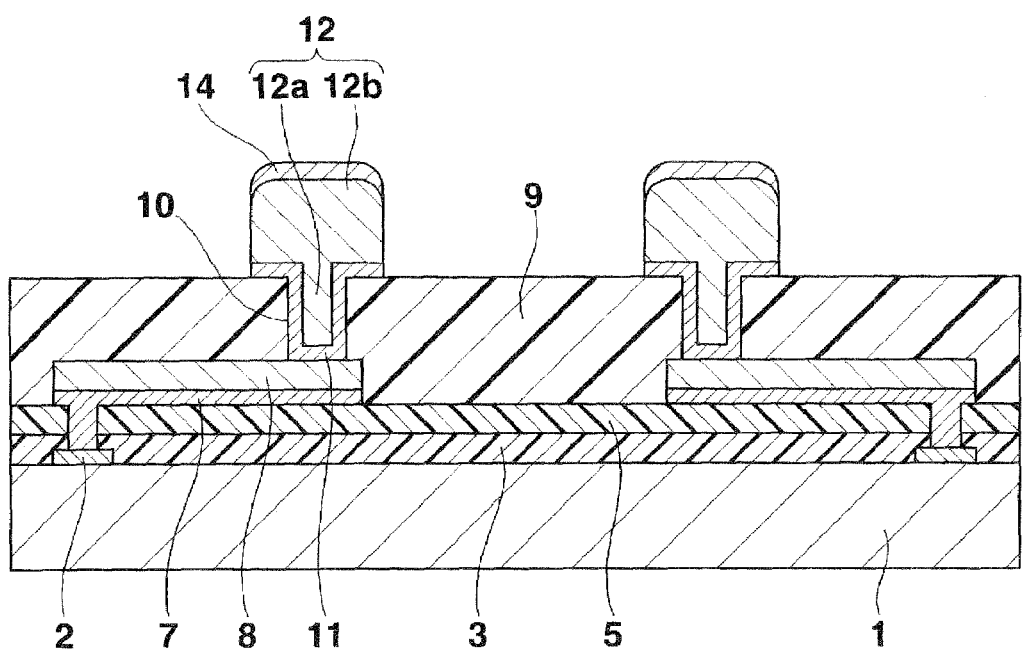
FIG. 16 is a sectional view of a semiconductor device as a fourth embodiment of this invention.

FIG. 16 is a sectional view of a semiconductor device as a fourth embodiment of this invention. This semiconductor device is different from the semiconductor device shown in FIG. 13 in that a solder ball 13 is omitted and alternately a surface treated layer 14 is formed on the upper surface of an upper portion 12b of a projecting electrode 12. In this case, for example, in a step as shown in FIG. 14, electrolytic plating with nickel and gold is successively carried out using the foundation metal layer 11 as a plating current path such that the surface treated layer 14 of a two-layer structure including nickel and gold is formed on the upper surface of the upper projecting electrode portion 12b in an opening 32 of a plating resist film 31. This surface treated layer 14 prevents, for example, the oxidation of the projecting electrode, and keeps good electric contact between the projecting electrode and an electrode, for example, a solder ball of another electric component which is electrically connected to this semiconductor device.

What is claimed is:
1. A semiconductor device manufacturing method comprising:
   forming a plurality of wiring lines on one side of a semiconductor substrate;
   forming, on the wiring lines and said one side of the semiconductor substrate, an overcoat film having openings in parts respectively corresponding to connection pad portions of the wiring lines;
   forming foundation metal layers each having an edge part, on inner surfaces of the openings of the overcoat film, on parts of the wiring lines in the openings, and on the overcoat film around the openings, the edge parts being located on the overcoat film around the openings;
   forming, by electrolytic plating, projecting electrodes on the foundation metal layers in the openings of the overcoat film and on the edge parts of the foundation metal layers, each of the projecting electrodes including a lower projecting electrode portion and an upper projecting electrode portion that has an edge part formed on the edge part of one of the foundation metal layers, wherein the upper projecting electrode portion is formed on the lower projecting electrode portion and on the edge part; and forming solder balls, such that solder balls cover upper surfaces of the upper projecting electrode portions and side surfaces of the edge parts of the foundation metal layers.

2. The semiconductor device manufacturing method according to claim 1, wherein forming the foundation metal layers includes:

forming a foundation-metal-layers-forming layer on the overcoat film; and etching the foundation-metal-layers-forming layer on the overcoat film using the upper projecting electrode portions as etching masks to form the edge parts of the foundation metal layers under the edge parts of the upper projecting electrode portions.

3. The semiconductor device manufacturing method according to claim 1, wherein the upper projecting electrode portions have parts that are formed on the foundation metal layers in the openings of the overcoat film.

4. The semiconductor device manufacturing method according to claim 1, wherein the projecting electrodes are formed after a plating resist film having openings larger than the openings of the overcoat film is formed on an upper surface of the foundation metal layer, wherein the openings of the plating resist film are respectively aligned with the openings of the overcoat film.

5. The semiconductor device manufacturing method according to claim 4, wherein forming the solder balls comprises forming a solder layer on the upper surface of the upper projecting electrode portion of each of the projecting electrodes, in the openings of the plating resist film, and then removing the plating resist film from the upper surface of the foundation metal layer.

6. The semiconductor device manufacturing method according to claim 5 wherein the solder layer is formed by electrolytic plating on the upper surface of the upper projecting electrode portion of each of the projecting electrodes.

7. The semiconductor device manufacturing method according to claim 6, wherein forming the solder balls further comprises forming, by reflow, solder balls made of the solder layers on the upper surfaces of the upper projecting electrode portions of the projecting electrodes after forming each of the solder layers.

* * * * *

UNITED STATES PATENT AND TRADEMARK OFFICE
CERTIFICATE OF CORRECTION

PATENT NO.       : 8,097,941 B2
APPLICATION NO.  : 12/566423
DATED            : January 17, 2012
INVENTOR(S)      : Norihiko Kaneko It is certified that error appears in the above-identified patent and that said Letters Patent is hereby corrected as shown below:

On the title page:

Item (73) Assignee;

change "Casio Computer Co., Ltd., Tokyo (JP)" to --Teramikros, Inc., Tokyo (JP)--.

Signed and Sealed this
Twenty-sixth Day of June, 2012

David J. Kappos
*Director of the United States Patent and Trademark Office*